United States Patent [19]
Tracy et al.

[11] Patent Number: 4,617,079
[45] Date of Patent: Oct. 14, 1986

[54] PLASMA ETCHING SYSTEM

[75] Inventors: David H. Tracy, Norwalk; Brian G. Balistee, Bridgeport, both of Conn.

[73] Assignee: The Perkin Elmer Corporation, Norwalk, Conn.

[21] Appl. No.: 722,623

[22] Filed: Apr. 12, 1985

[51] Int. Cl.[4] .................. H01L 21/306; B44C 1/22; C03C 15/00; C23F 1/02
[52] U.S. Cl. .................................. 156/345; 156/643; 156/646; 204/192.32; 204/298
[58] Field of Search ............ 204/192 E, 298, 164, 204/192 EC; 118/50.1, 620, 728; 427/38, 39; 156/345, 643, 646

[56] References Cited
U.S. PATENT DOCUMENTS 4,464,223  8/1984  Gorin ........................... 156/646 X
4,500,563  2/1985  Ellenberger et al. ........... 156/345 X
4,579,618  4/1986  Celestino et al. ................ 156/345

Primary Examiner—William A. Powell
Attorney, Agent, or Firm—Thomas P. Murphy; Edwin T. Grimes; Francis L. Masselle

[57] ABSTRACT

A relatively small amount of high frequency RF power is mixed with a predominantly low frequency RF power to provide an improved etch rate uniformity of a semiconductor wafer in a low frequency plasma etching system.

8 Claims, 2 Drawing Figures

4,617,079

PLASMA ETCHING SYSTEM

BACKGROUND OF THE INVENTION

Low frequency plasma etching systems are well known. In such systems, a planar reactor is provided into which a gas mixture, such as Argon, carbon tetrafluoride, and fluoroform is injected at a low pressure. A pair of electrodes within the reactor receives power from a source of low frequency outside the reactor and the gas is ionized to form a plasma. A semiconductor wafer, such as silicon with a silicon dioxide film, is placed on one of the electrodes. The applied power to the electrodes and plasma formed within the reactor cause etching of the film in areas where no photoresist material is present.

One of the problems in many low frequency plasma etching systems is that there are a number of non-uniformity problems which are evidenced by some areas of the wafer etching faster than other areas. These non-uniformities are of various sorts. Some of them involve very gradual non-uniformities over the large areas of the wafers while others are very localized. Such localized patterns include small spots which tend to etch very fast. In other cases, small, narrow rings are formed all around the wafer at a certain radii where etching occurs as much as 10 or 20% faster than the rest of the wafer. Non-uniformities are visible to the eye when the wafer is removed from the reactor after being partially etched.

Non-uniformities, being visible, appear as colored interference patterns on a wafer with a silicon dioxide film. Some parts of the surface of the wafer become defective and may not yield working devices when the wafer is ultimately diced. In semiconductor device fabrication, sufficient over etch time is required to insure that the film is completely etched in the slowest area of the wafer. This means that in areas of faster etching, the substrate under the film being etched is subject to attack and possible damage by the plasma.

OBJECTS OF THE INVENTION

It is an object of this invention to provide an improved low frequency etching process.

It is a further object of this invention to provide an improved low frequency etching process which reduces non-uniformities of high spatial frequency, such as fast etching rings, spots and the like.

BRIEF SUMMARY OF THE INVENTION

In accordance with the present invention, a plasma etching process includes a planar reactor having gas therein and a pair of electrodes with one of the electrodes disposed to receive thereon a wafer to be etched. Sources of power connected across the electrodes include a source of relatively low radio frequency signals having a predetermined output power for providing the main source of energy in the etching process and a source of relatively high radio frequency signals having a predetermined output power substantially lower than the source of low radio frequency signals. The low and high radio frequency signals are applied to a combining circuit with the combined signals being applied across the electrodes. The combining circuit also includes means for electrically isolating the sources of high and low frequency signals from each other.

Other objects and advantages of the present invention will be apparent and suggest themselves to those skilled in the art, from a reading of the following specification and claims, taken in conjunction with the accompanying drawing.

DESCRIPTION OF THE INVENTION

Figure 1:
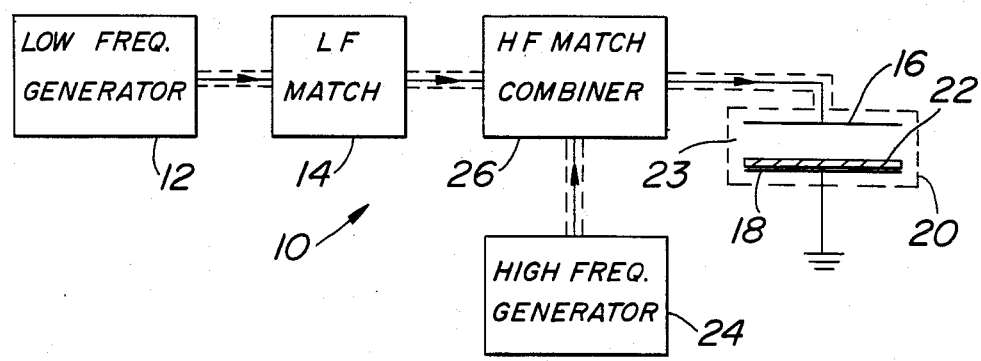
FIG. 1 is a schematic diagram illustrating generally a modified low frequency plasma etching system, in accordance with the present invention.

Referring to FIG. 1, a low frequency plasma etching system 10 comprises a source of low frequency RF signals 12. The output signals from the source 12 are applied through a low frequency matching network 14. In a normal low frequency plasma etching circuit used heretofore, the output signals from the low frequency source would be applied across a pair of electrodes 16 and 18 to ionize gas to form a plasma in a planar reactor 20. A wafer 22, having suitable photoresist material thereon, is disposed on the electrode 18 for etching.

The present invention involves modification of the conventional low frequency RF etching system. The modification involves the use of a source of high frequency RF signals and combining such high frequency signals with the low frequency signals from source 12. In the embodiment illustrated, low frequency signals from the matching network 14 and high frequency signals from the source 24 are applied to a high frequency matching and combining circuit 26.

In practicing the present invention, the power of the high frequency signals from source 24 is increased until the desired smoothness of etch uniformity is obtained, as measured by the partly etched films. It has been found that the power of the high frequency signals from source 24 may be between 5% and 10% of the low frequency power from the source 12. High selectivity etching of $SiO_2$ and various glass films on 100 mm and 125 mm silicon wafers were successful when the powers applied from the low and high frequency sources were in these ranges. It was also found that the mixing of the relatively low levels of high frequency signals with the high levels of low frequency signals did not materially affect the process results in the system, but only improved the etch uniformity.

In the embodiment illustrated in FIG. 1, typical requirements for $SiO_2$ etching of 125 mm wafers would be 450 Watts, 400 kHZ from the source of low frequency signals 12; 30 Watts at 27.13 MHz as from the source of high frequency signals 24, 2.0 torr process pressure in chamber 23 of the planar reactor 20. The electrodes 16 and 18 would be made of graphite and aluminum, respectively. The gap between wafer 22 and electrode 16 would be about 0.25 inches with a gas flow of about 200 sccm for Argon, 40 sccm for $CF_4$ and 40 sccm for $CHF_3$ gas.

Figure 2:
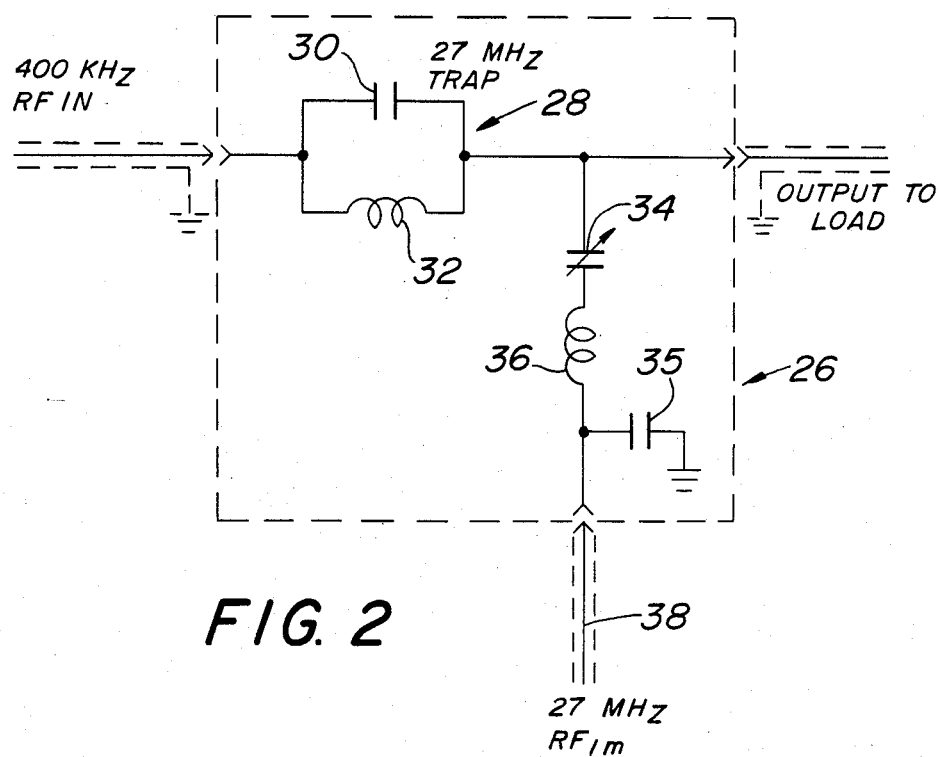
FIG. 2 is a schematic diagram of a combining circuit, which may be used in the system illustrated in FIG. 1.

The high frequency matching and combining circuit 26 may take a variety of different forms. One such form is illustrated in FIG. 2. The purpose of the circuit 26 is to isolate the low and high frequency sources 12 and 24 from each other.

Referring to FIG. 2, a high frequency trap 28 is tuned to the frequency of the high frequency source 24, for example 27.13 MHz, and comprises a capacitor 30 and an inductor 32 connected in parallel. The trap 28 prevents signals from the source 24 being fed back to the source 12. At the same time, low frequency signals from the source 12 are permitted to pass through the trap 28 without being attenuated.

A capacitor 34 effectively isolates the high frequency source 24 from the low frequency signals which pass through the trap 28.

A match network comprising a capacitor 35, an inductor 36 and the capacitor 34 matches the impedance of the high frequency source 24 at line 38 to the load. In one embodiment, the impedance of the high frequency source 24 may be 50 ohms, while the load impedance approximates 300–400 ohms resistance in parallel with 100–200 pF capacitance.

The capacitors 35 and 34 are adjustable to provide minimum high frequency power being reflected back to the source 24 while plasma is being excited by the low frequency signals from the source 12. When the low frequency discharge is not present, the load impedance changes greatly, and the high frequency signal from the source 24 is poorly matched with the load.

The theory as to why the addition of a relatively small level of high frequency signals improves a low frequency etching system is not precisely understood. The operating hypothesis, however, is that adding the high frequency discharge maintains a plasma at all times. It is known that in low frequency etching processes involving 400 kilohertz alone that the plasma essentially goes out on alternate half cycles. This is evident by viewing the light coming out with a photo-multiplier from the plasma which goes off at every zero crossing as nearly as can be detected.

When the 27 megahertz signals are added, there is sufficient power to maintain a steady discharge within the plasma chamber even without the low frequency signals. It is a weak discharge, but it is there. The ions in the plasma chamber maintain optical emission all the time. It is possible that the instabilities and non-uniformities in the etched wafers arise as a result of the constant turning off and turning on of the plasma. By maintaining a sort of a uniform ionization over the whole wafer all the time, the etching becomes more uniform.

What is claimed is:

1. In combination with a plasma etching process including a planar reactor for producing plasma gas therein and a pair of electrodes with one of the electrodes disposed to receive thereon a wafer to be etched, a source of power connected across said pair of electrodes comprising:

(a) a source of relatively low radio frequency signals having a predetermined output power for providing the main source of energy for etching said wafer;
(b) a source of relatively high radio frequency signals having a predetermined output power substantially lower than said source of said relatively low radio frequency signals;
(c) a combining circuit;
(d) means for applying said low radio frequency signals and said high radio frequency signals to said combining circuit; and
(e) means for applying the combined high and low radio frequency signals from combining circuit across said pair of electrodes.

2. The invention as set forth in claim 1 wherein said combining circuit includes means for isolating said sources of high and low frequency signals from each other.

3. The invention as set forth in claim 2 wherein said combining circuit further comprises a radio frequency trap tuned to the frequency of the high frequency signals from said high frequency source to prevent said high frequency signals from being fed back into said source of low frequency signals.

4. The invention as set forth in claim 3 wherein said combining circuit further comprises capacitive means to prevent the low frequency signals passing through said radio frequency trap from reaching said source of high frequency signals.

5. The invention as set forth in claim 4 wherein said combining circuit further comprises a match network providing an impedance transformation to minimize high frequency power from being reflected back to said source of high frequency signals while plasma is being generated in said planar reactor by said source of low frequency signals.

6. The invention as set forth in claim 5 wherein said match network further comprises an impedance which changes when plasma is not being generated in said planar reactor and said high frequency source is not matched to a load including said planar reactor.

7. The invention as set forth in claim 6 wherein the frequency of said low frequency signals is approximately 400 kHz.

8. The invention as set forth in claim 7 wherein the frequency of said high frequency signals is about 27 MHz.

* * * * *